United States Patent
Klümper

(10) Patent No.: US 12,044,206 B2
(45) Date of Patent: Jul. 23, 2024

(54) WIND TURBINE AND A METHOD FOR LOCATING AN EVENT CORRESPONDING TO A FAILURE OF A HEATING ELEMENT AT A WIND TURBINE BLADE

(71) Applicant: General Electric Renovables Espana, S.L., Barcelona (ES)

(72) Inventor: Stephan Klümper, Salzbergen (DE)

(73) Assignee: General Electric Renovables Espana, S.L., Barcelona (ES)

( * ) Notice: Subject to any disclaimer, the term of this patent is extended or adjusted under 35 U.S.C. 154(b) by 81 days.

(21) Appl. No.: 17/833,140

(22) Filed: Jun. 6, 2022

(65) Prior Publication Data

US 2022/0397098 A1 Dec. 15, 2022

(30) Foreign Application Priority Data

Jun. 9, 2021 (EP) .................................. 21178568

(51) Int. Cl.
*F03D 17/00* (2016.01)
*F03D 1/06* (2006.01)
(Continued)

(52) U.S. Cl.
CPC ........... *F03D 17/00* (2016.05); *F03D 1/0675* (2013.01); *F03D 80/40* (2016.05);
(Continued)

(58) Field of Classification Search
CPC .... F03D 17/00; F03D 17/002; F03D 17/0065; F03D 17/012; F03D 17/013; F03D 80/301; F03D 80/401; F03D 80/50; G01R 19/003

See application file for complete search history.

(56) References Cited

U.S. PATENT DOCUMENTS

| 9,415,875 B2* | 8/2016 | Stiesdal | F03D 80/40 |
| 2013/0022466 A1* | 1/2013 | Laurberg | F03D 80/40 |
| | | | 219/539 |

(Continued)

FOREIGN PATENT DOCUMENTS

| DE | 102008051553 A1 | 4/2010 |
| EP | 3436698 B1 | 1/2020 |
| WO | WO2019/001658 A1 | 1/2019 |

OTHER PUBLICATIONS

European Search Report Corresponding to EP21178568 on Dec. 3, 2021.

(Continued)

*Primary Examiner* — Courtney D Heinle
*Assistant Examiner* — Danielle M. Christensen
(74) *Attorney, Agent, or Firm* — Dority & Manning, P.A.

(57) ABSTRACT

A wind turbine and a method for locating an event corresponding to a failure of a heating element at a wind turbine blade, the heating element comprising an electric resistive material configured to generate heat using electrical power, the method comprising: —providing a location of an event corresponding to a failure of a heating element, wherein the heating element is in an Ohmic contact with a reference potential; —applying a voltage impulse to the heating element relative to the reference potential at a first point in time; —measuring a voltage at the reference potential at a second point in time; —determine the location based at least on the first point in time and the second point in time.

8 Claims, 4 Drawing Sheets

(51) Int. Cl.
    *F03D 80/40*          (2016.01)
    *G01R 19/00*          (2006.01)
    *H05B 1/02*           (2006.01)

(52) U.S. Cl.
    CPC ........ *F05D 2260/83* (2013.01); *G01R 19/003* (2013.01); *H05B 1/023* (2013.01)

(56) References Cited

U.S. PATENT DOCUMENTS

2020/0300226 A1    9/2020    Buggy
2021/0151975 A1    5/2021    Wood et al.

OTHER PUBLICATIONS

European Search Report Corresponding to EP21178568 on Mar. 7, 2022.

* cited by examiner

WIND TURBINE AND A METHOD FOR LOCATING AN EVENT CORRESPONDING TO A FAILURE OF A HEATING ELEMENT AT A WIND TURBINE BLADE

FIELD

The present disclosure relates generally to wind turbines, and more particularly to a failure of a heating elements in a wind turbine blade.

BACKGROUND

Wind power is considered one of the cleanest, most environmentally friendly energy sources presently available, and wind turbines have gained increased attention in this regard. A modern wind turbine typically includes a tower, generator, gearbox, nacelle, and one or more rotor blades. The rotor blades capture kinetic energy from wind using known foil principles and transmit the kinetic energy through rotational energy to turn a shaft coupling the rotor blades to a gearbox, or if a gearbox is not used, directly to the generator. The generator then converts the mechanical energy to electrical energy that may be deployed to a utility grid.

The build-up and spread of ice on the blade surface, in particular on the tip portion of the blade, changes the blade aerodynamics and may also lead to increased vibrations and loading on the blade, all of which lead to a reduction in power output. Due to the large length of the blades of for example, 50 m or 70 m, the velocity of the blade tips can be very high. Mass and/or cross section changes due to ice on the blades may have critical influences on the mass distribution and the aerodynamics of the wind turbine. In more severe cases, the turbine may need to be shut down upon accumulation of ice to prevent excessive loading of the blades, which may damage or prematurely fatigue the blade components.

To prevent ice from accumulating on the blades, the wind turbine blades have been equipped with heating elements. The heating elements prevent the accumulation of ice on blades (anti-icing) and remove the ice from the blades after the ice accumulation (de-icing).

A resistive material connected to a power supply may be utilized as a heating element. The resistive material may be located near the surface of the turbine blade and may be embedded in each blade and powered on to prevent ice accumulation. Over time, the heating element may begin to fail due to a variety of external conditions, such as lightning strikes, bird strikes, fatigue during operation, or contact with other ambient conditions. The failure of the heating element affects the de-icing and anti-icing processes leading to an accumulation of ice on the surface of the blade.

Therefore, there is a need to monitor the status of heating elements.

Accordingly, the present disclosure is directed to identifying and/or locating an event corresponding to a failure of a heating element in a wind turbine blade.

BRIEF DESCRIPTION

Aspects and advantages of the invention will be set forth in part in the following description, or may be obvious from the description, or may be learned through practice of the invention. The invention is defined by the appended claims.

In one aspect, the present disclosure is directed to a method for identifying an event corresponding to a failure of a heating element at a wind turbine blade, the heating element comprising an electric resistive material configured to generate heat using electrical power. The method comprises: providing a desired value for a parameter indicative of a capacitance and/or or a leakage of the heating element relative to a reference potential; applying a voltage to the heating element relative to the reference potential; determining a real value of the parameter indicative of a capacitance and/or or a leakage of the heating element relative to a reference potential; comparing the real value to the desired value; determining, at least partially based on the comparison, whether an event corresponding to a failure of the wind turbine blade or the heating element in the wind turbine blade has occurred. It should be understood that the method may further include any of the additional steps and/or features as described herein.

In another aspect, the present disclosure is directed to a wind turbine comprising a wind turbine blade and a heating element at the wind turbine blade the heating element comprising an electric resistive material configured to generate heat using electrical power, the wind turbine further comprising a voltage supply and control system configured to: apply a voltage to the heating element relative to a reference potential; and determine a value of the parameter indicative of a capacitance and/or a leakage of the heating element relative to a reference potential. The wind turbine further comprising a controller configured to: compare the real value to the desired value; and determine, at least partially based on the comparison, whether an event corresponding to a failure of the wind turbine blade or the heating element in the wind turbine blade has occurred. It should be understood that the wind turbine may further include any of the additional features as described herein. In particular, features relating the method may be combined with the corresponding wind turbine and vice versa.

In another aspect, the present disclosure is directed to a method for locating an event corresponding to a failure of a heating element at a wind turbine blade, the heating element comprising an electric resistive material configured to generate heat using electrical power, the method comprising: providing a location of an event corresponding to a failure of a heating element, wherein the heating element is in an Ohmic contact with a reference potential; applying a voltage impulse to the heating element relative to the reference potential at a first point in time; measuring a voltage at the reference potential at a second point in time; determine the location based at least on the first point in time and the second point in time.

In another aspect, the present disclosure is directed a wind turbine comprising a wind turbine blade and a heating element at the wind turbine blade the heating element comprising an electric resistive material configured to generate heat using electrical power, the wind turbine further comprising a voltage supply and control system configured to: apply a voltage impulse to the heating element relative to the reference potential at a first point in time; measure a voltage at the reference potential at a second point in time, and determining the location based at least on the first point in time and the second point in time.

These and other features, aspects and advantages of the present invention will be further supported and described with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which refers to the appended figures, in which.

DETAILED DESCRIPTION

Figure 1:
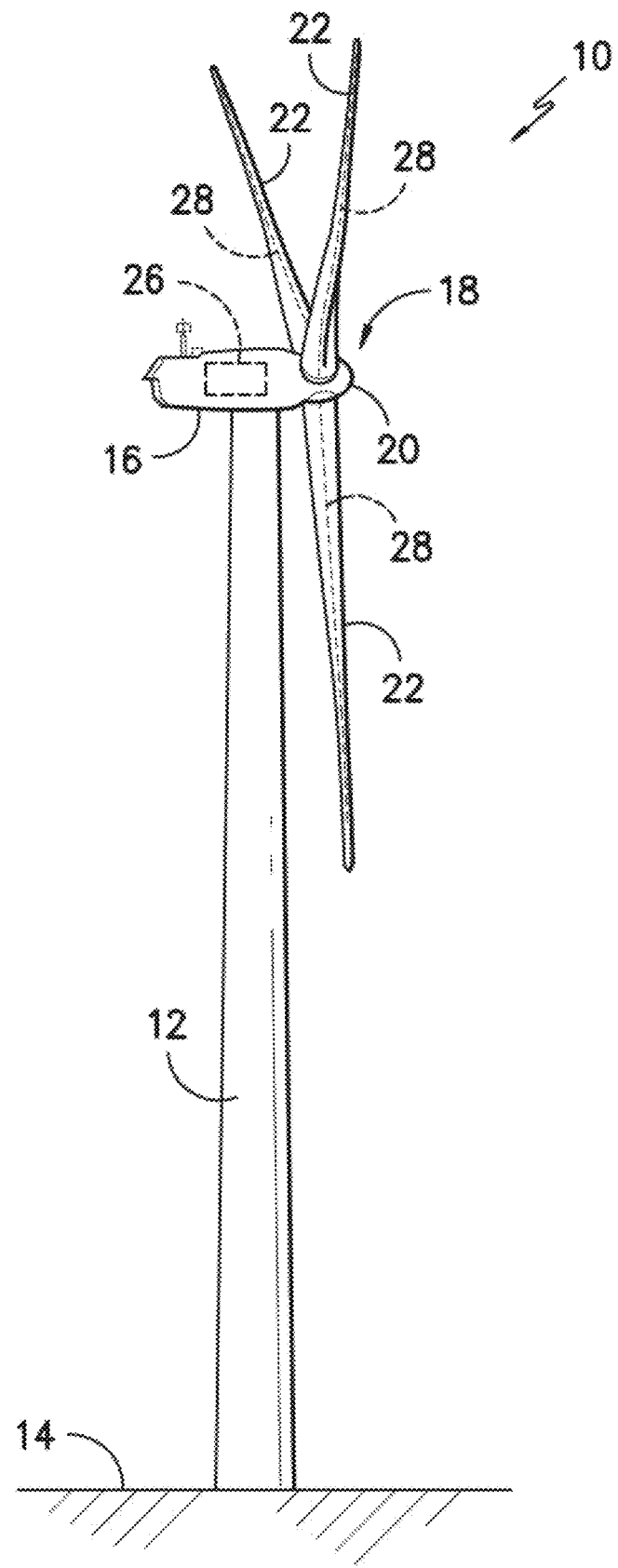
FIG. 1 illustrates a perspective view of a wind turbine.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Referring now to the drawings, FIG. 1 illustrates a perspective view of a wind turbine 10 according to the present disclosure. As shown, the wind turbine 10 generally includes a tower 12 extending from a support surface 14, a nacelle 16 mounted on the tower 12, and a rotor 18 coupled to the nacelle 16.

As shown in FIG. 1, the rotor 18 includes a rotatable rotor hub 20 and at least one blade 22 coupled to and extending outwardly from the rotor hub 20. For example, in the illustrated embodiment, the rotor 18 includes three blades 22. However, in an alternative embodiment, the rotor 18 may include more or less than three blades 22. Each blade 22 may be spaced about the rotor hub 20 to facilitate rotating the rotor 18 to enable kinetic energy to be transferred from the wind into usable mechanical energy, and subsequently, electrical energy. For instance, the rotor hub 20 may be rotatably coupled to an electric generator positioned within the nacelle 16 to permit electrical energy to be produced.

The wind turbine 10 may also include a wind turbine controller 26 centralized within the nacelle 16. However, in other embodiments, the controller 26 may be located within any other component of the wind turbine 10 or at a location outside the wind turbine 10. Further, the controller 26 may be communicatively coupled to any number of the components of the wind turbine 10 in order to control the components. As such, the controller 26 may include a computer or other suitable processing unit. Thus, in several embodiments, the controller 26 may include suitable computer-readable instructions that, when implemented, configure the controller 26 to perform various different functions, such as receiving, transmitting and/or executing wind turbine control signals.

Figure 2:
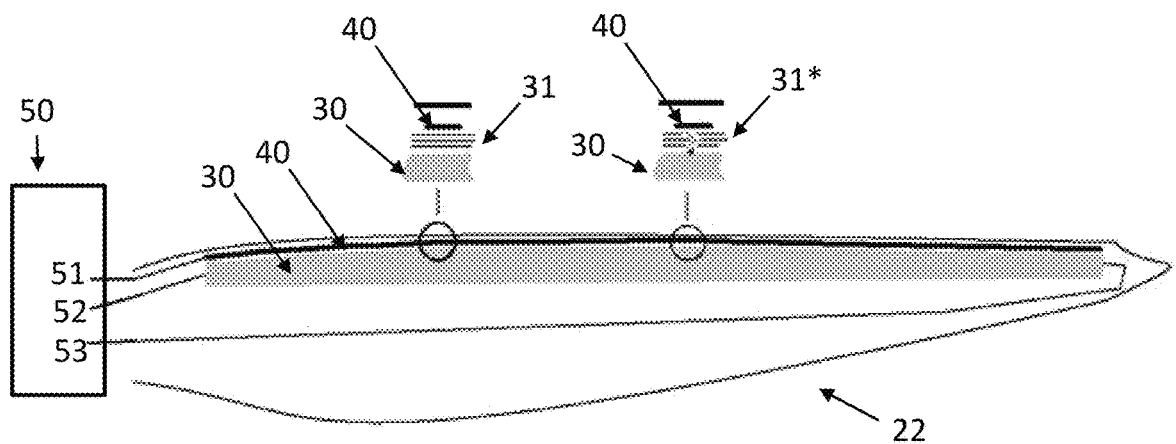
FIG. 2 illustrates a wind turbine blade according to the present disclosure.

As shown in FIG. 2, a wind turbine 10 comprises a wind turbine blade 22 and a heating element 30 at the wind turbine blade 22 the heating element 30 comprising an electric resistive material configured to generate heat using electrical power, the wind turbine further comprising a voltage supply and control system 50 configured to: apply a voltage to the heating element 30 relative to a reference potential; and determine a value of the parameter indicative of a capacitance and/or a leakage of the heating element relative to a reference potential.

Figure 3:
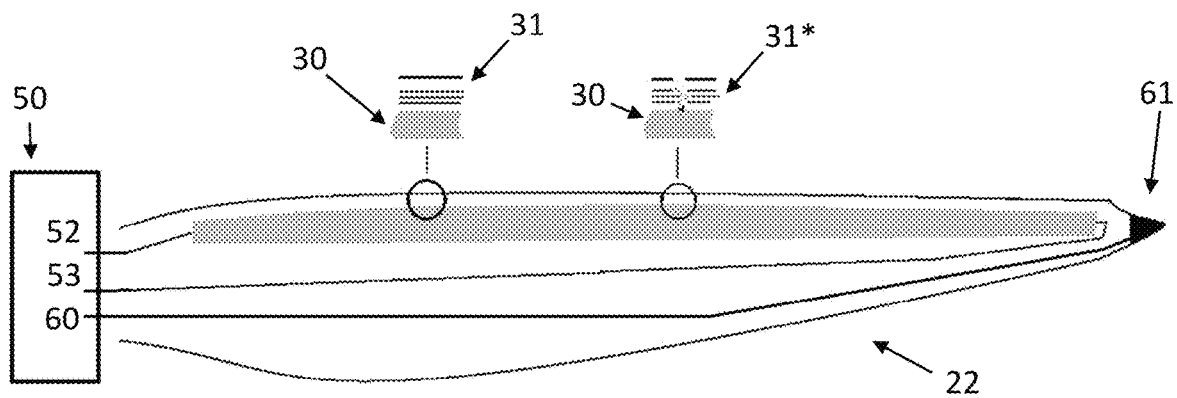
FIG. 3 illustrates yet another wind turbine blade according to the present disclosure.

Heating element 30 comprises an electric resistive material configured to generate heat using electrical power, for example, carbon. The electric resistive material can be insulated by an insulation 31. As shown in FIGS. 2 and 3, the heating element 30 has first and second connections 52, 53 to be connected to a supply voltage for normal operation. An AC supply voltage may be between 500 V and 1000 V. In particular, the AC supply voltage can be 690 V using a 50 Hz frequency or 575 V using a 60 Hz frequency.

An ideal heating element 30 would be perfectly insulated and it should hold an electrical charge forever. However, a real heating element 30, although having an insulation 31, always has leakage which is the gradual transfer of electrical energy across the insulation. Heating element 30 should hold an electrical load (a defined charge) over a specific time range.

FIGS. 2 and 3 show heating element 30 located along blade 22. Heating elements 30 are located near the surface of turbine blade 22. The heating element may be embedded in wind turbine blade 22. However, in some examples, heating element 30 may be located only in one half of blade 22, specifically near the tip.

According to an aspect, heating element 30 is a heating mat 30. Heating element 30 can be, for example, a continuous mat or multiple mats placed next to each other along the blade 22.

The reference potential can be a potential which is electrically connected to a ground potential of the wind turbine. The ground potential or grounding can be a Protective Earth (PE) or Neutral conductor of the wind turbine. This is sometimes also indicated as "earth", "ground" or "mass". The conductor corresponding to the reference potential can be a protective earth (PE) mat located adjacent the heating mat 30 as shown in FIG. 2. The PE mat 40 can be configured to protect the heating mat 30 from lightning strikes. For example, the PE mat 40 can comprise a conducting metal like copper to guide the energy of the lightning to a grounding of the wind turbine.

According to an aspect, PE mat 40 and heating mat 30 are insulated from each other with an insulation layer 31.

As shown in FIG. 3, blade 22 can comprise a grounding 61 configured to protect blade 22 from lightning strikes. Grounding 61 can be located near the tip of blade 22. Grounding 61 can also be located partially along the length of blade 22. Grounding 61 is connected to Protective Earth (PE) or Neutral conductor at the wind turbine. The conductor corresponding to the reference potential can be a ground conductor 60 connecting grounding 61 with the Protective Earth (PE) or Neutral conductor of the wind turbine. Ground conductor 60 is located at blade 22 so that an electric field can be applied between ground conductor 60 and heating element 30. Ground conductor can be used as a reference potential as further described in detail below. Ground conductor 60 is sometimes referred as Protective Earth (PE) or Neutral conductor.

Figure 6:
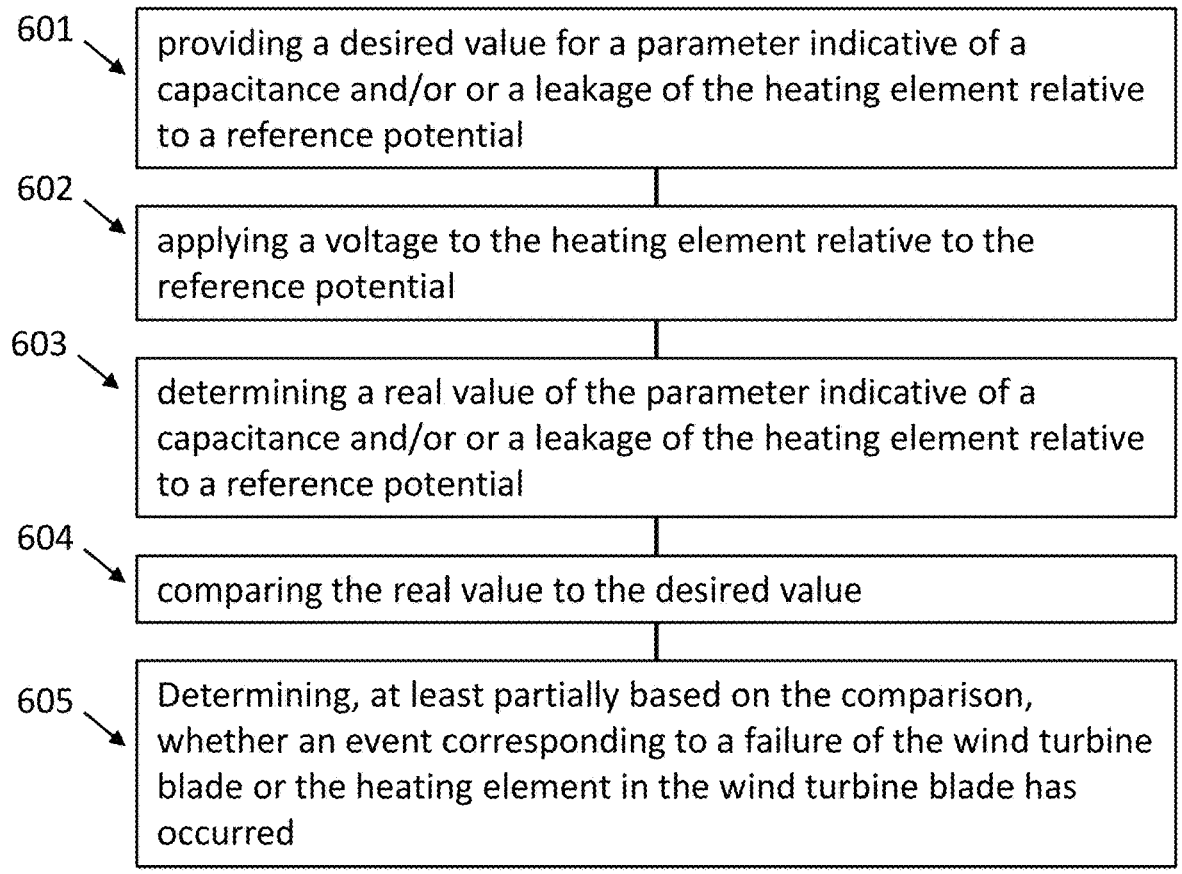
FIG. 6 illustrates a flow diagram according to embodiments of a method of identifying an event corresponding to a failure of a heating element at a wind turbine blade.

A method for identifying an event corresponding to a failure of a heating element at a wind turbine blade is shown in FIG. 6, the heating element comprising an electric resistive material configured to generate heat using electrical power, the method comprising: —providing a desired value for a parameter indicative of a capacitance and/or or a leakage of the heating element relative to a reference potential 601; —applying a voltage to the heating element relative to the reference potential 602; determining a real value of the parameter indicative of a capacitance and/or or a leakage of the heating element relative to a reference potential 603; —comparing the real value to the desired value 604; —determining, at least partially based on the comparison of the real value to the desired value, whether an event corresponding to a failure of the wind turbine blade or the heating element in the wind turbine blade has occurred 605.

A voltage is applied to heating element 30 relative to the reference potential in step 602. Usually, heating element 30 should be insulated from the reference potential. The reference potential is not one of the first and second connections 51, 53 to be connected to the supply voltage of heating element 30, since first and second connections 51, 53 are in Ohmic contact via the resistive material of heating element 30 and the capacitance between them would be approximately zero.

The reference potential corresponds to a conductor located in blade 22. An electric field can be created between heating element 30 and the conductor corresponding to the reference potential. The conductor can be, for example, a grounding 61 of the blade or a ground conductor 60 of the blade as shown in FIG. 3 or a PE mat 40 as shown in FIG. 2.

FIGS. 2 and 3 both illustrate events corresponding to a failure of a heating element at a wind turbine blade 22. FIG. 2 shows a break of the insulation 31* in which the heating element 30 can have an Ohmic contact with the PE mat 40. FIG. 3 shows a break of the insulation 31* in which the heating element 30 is exposed to air and moisture on the surface of blade 22 which builds up a connection to grounding 61 and/or grounding conductor 60. An event corresponding to a failure of the wind turbine blade or the heating element can influence the capacitance of the heating element and/or the leakage of the heating element relative to a reference potential. A further advantage of using a parameter indicative of a capacitance and/or or a leakage of the heating element compared to a simple measurement of a resistance of the heating element is, that high voltages can be used because only very small leakage currents occur. Specifically, voltages higher than the operation voltage of the heating element can be used. Therefore, signs of failure can be detected earlier.

When the voltage is applied between the conductor of the reference potential and one of first or second connection 52, 53 of heating element 30, the remaining connection 52, 53 can be not connected and "open", so that an electric field is created between the conductor corresponding to the reference potential and heating element 30.

Figure 4:
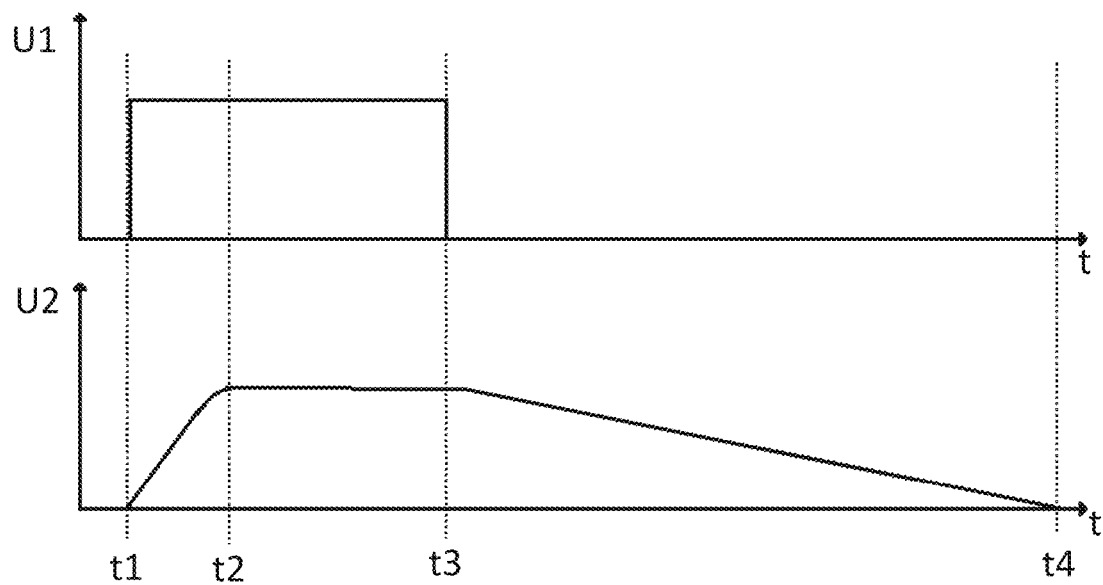
FIG. 4 illustrates voltage curves over time according to the present disclosure.

FIG. 4 shows a voltage U1 applied between heating elements 30 via first or second connection 52, 53 and a reference potential using a voltage supply and control system 50. The reference potential is the potential of grounding 61 and/or grounding conductor 60 in FIG. 3 and of PE mat 40 with its connection 51 in FIG. 2. The heating element 30 together with the reference potential form a system with a capacitance and a resistance. Voltage U2 shows the voltage over this system.

Voltage U2 shows a charging graph of the system. It shows how many time constants a voltage must be applied to the system before the capacitor of the system reaches a given percentage of the applied voltage. The curve depends on the capacitance and the resistance of the system.

In some example, the capacitance C, the resistance R and/or a product of them (RC) is a parameter or are parameters indicative of a capacitance and/or or a leakage of the heating element relative to a reference potential. In some other examples, a parameter indicative of a capacitance and/or or a leakage of the heating element relative to a reference potential may be a time in which the system reaches a certain percentage of final voltage.

As shown in FIG. 4, the voltage over the system U2 follows the capacitor charging equation between t1 and t2, which is:

$$U2=U1[1-\exp(-(t2-t1)/RC)]$$

Voltage curve U2 in FIG. 4 also shows the discharge of the system due to leakage after voltage U1 is shut down. Determining a real value may include: measuring electrical charge degradation of the heating element relative to a reference potential over time.

Discharge is shown between t3 and t4 of FIG. 4. The speed of discharge is a measure for the health of the insulation of heating element 30. In some examples, a parameter indicative of a capacitance and/or or a leakage of the heating element relative to a reference potential can be a time in which the voltage of the system declined to a certain percentage of the initial voltage.

In general, the parameter may be measured when blade 22 is used for the first time and used as a desired value or reference value for future measurements. The desired value can be stored in a database.

FIG. 4 shows both, the charge and the discharge. The method according to some embodiments may include measurement during the charge between t1 and t2, a measurement during the discharge between t3 and t4, or both.

Determination of the real value of the parameter indicative of a capacitance of the heating element relative to a reference potential and/or or a leakage of the heating element relative to a reference potential can include, for example, a measurement of voltage, current and/or time and may further include calculations.

Comparing the real value to the desired value may include to determine an absolute difference and/or a relative difference. A determination whether an event corresponding to a failure of the wind turbine blade or the heating element in the wind turbine blade has occurred is at least partially based on the comparison. For example, an event may be registered if the real value differs from the desired value by a certain percentage or by a predefined absolute value. A certain percentage can be 10% or 20% or 30%.

In some examples, the method further comprises: storing the real value in a database. The determination whether an event corresponding to a failure of the wind turbine blade or the heating element in the wind turbine blade has occurred can be further be based on the one or more real values stored in the database. For example, the ability of heating element 30 to store charge may decrease slowly over time and the parameter indicative of a capacitance and/or or a leakage of the heating element relative to a reference potential may change slowly over time due to normal wearing. These slow changes may be treated as normal changes. However, abrupt changes of the parameter may indicate an event corresponding to a failure of the wind turbine blade or the heating element in the wind turbine blade, for example a damage at the heating element which creates an Ohmic contact with a ground conductor or a protection earth conductor.

In some example, the amplitude of the applied voltage to the heating element 30 relative to the reference potential can be at least an amplitude of the operation voltage of the heating element 30, specifically at least twice the amplitude of the operation voltage and more specifically between twice the operation voltage and twice the operation voltage plus 800 V.

In other examples, the amplitude of the applied voltage to the heating element relative 30 to the reference potential can be between 1 kV and 2.5 kV.

Figure 7:
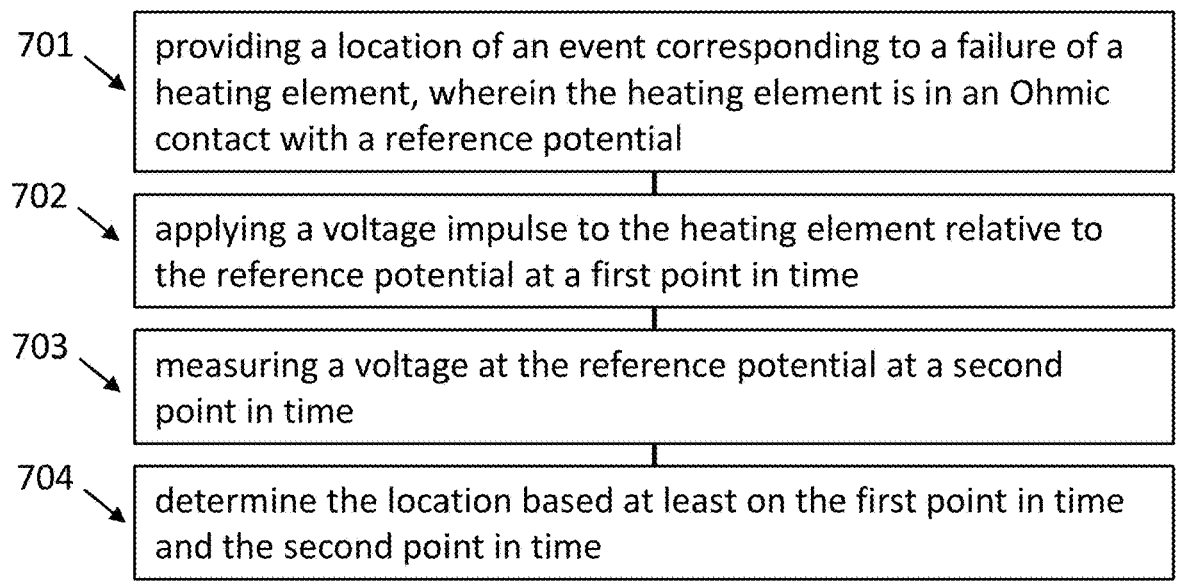
FIG. 7 illustrates a flow diagram according to embodiments of a method for locating an event corresponding to a failure of a heating element at a wind turbine blade.

According to another aspect, a method for locating an event corresponding to a failure of a heating element at a wind turbine blade, the heating element comprising an electric resistive material configured to generate heat using electrical power is suggested and shown in FIG. 7. The method comprises: providing a location of an event corresponding to a failure of a heating element, wherein the heating element is in an Ohmic contact with a reference potential 701; applying a voltage impulse to the heating element relative to the reference potential at a first point in time 702; measuring a voltage at the reference potential at a second point in time 703; determine the location based at least on the first point in time and the second point in time 704. This method has the advantage that the location of the event corresponding to a failure of a heating element can be identified and potentially repaired.

A location of an event corresponding to a failure of a heating element, wherein the heating element is in an Ohmic contact with a reference potential can be a damage of an insulation 31* as shown in FIG. 2 or 3.

Figure 5:
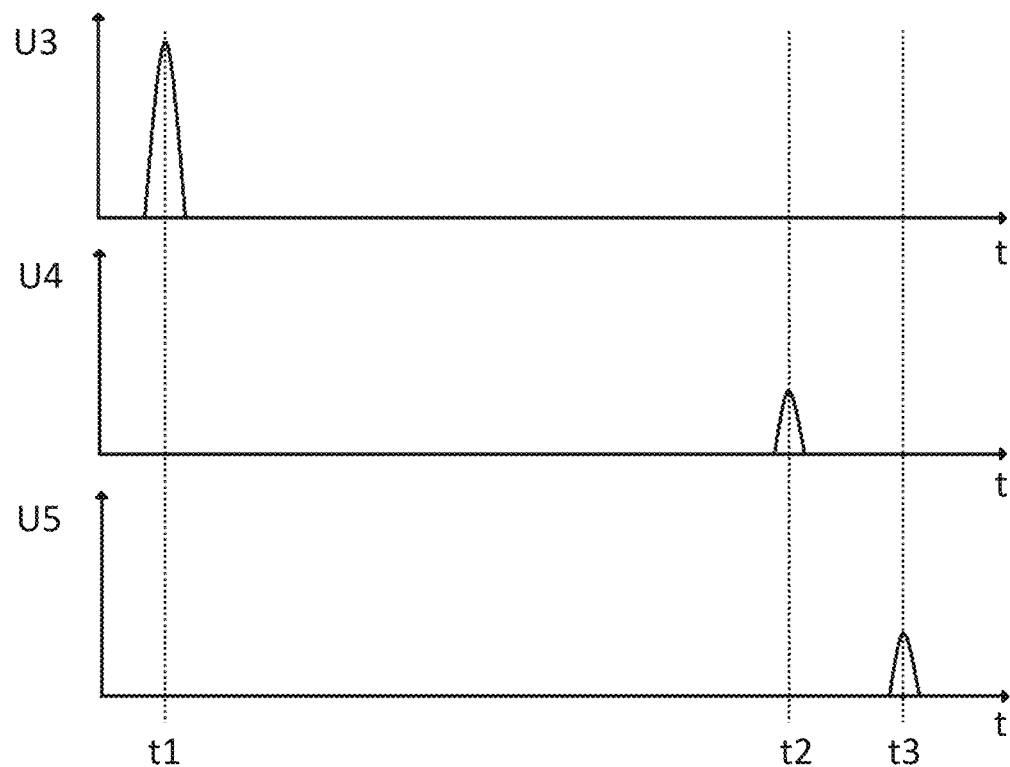
FIG. 5 illustrates other voltage curves over time according to the present disclosure.

FIG. 5 illustrates an example of a voltage impulse U3 which is applied to the heating element 30 relative to a reference potential as already described in FIGS. 2 and 3. With regard to FIG. 2, voltage U3 is a voltage between a first connection 52 of heating element 30 and a connection 51 of PE mat 40. With regard to FIG. 3, voltage impulse U3 is a voltage impulse applied between first connection 52 of heating element 30 and ground conductor 60.

Voltage impulse can be created at voltage supply and control system 50 which is configured to: apply a voltage impulse to the heating element relative to the reference potential at a first point in time; and measure a voltage at the reference potential at a second point in time. Voltage supply and control system 50 can comprise, for example, a controller configured to measure a time or a time difference. The time difference between the first and second point in time t1, t2 can be, for example, between 0.05 and 1 microseconds. It is particularly useful to use an integrated microcontroller of the voltage supply and control system 50 to determine the first and second point in time and/or the resulting time difference.

When the voltage impulse is applied between the conductor of the reference potential and one of first or second connections 52, 53 of heating element 30, the other connection 52, 53 can be not connected and "open", so that the impulse travels from heating element 30 to the conductor corresponding to the reference potential. In other examples, second connections 52, 53 of heating element 30 can be also connected to voltage supply and control system 50.

The method is comparable to a reflection measurement of a cable conductor with a short circuit in the end which is known as reflectometry. However, cable length reflectometry uses voltage impulses of approximately 1 V, while the present method used a much higher voltage for the impulse amplitude. The heating element has a higher resistance compared to a normal conductor. Accordingly, much higher voltages should be used.

The voltage impulse of FIG. 5 is a needle impulse. A needle impulse can be defined as an impulse having a voltage amplitude which rises sharply and declines sharply immediately after the maximum voltage amplitude is reached. However, other impulse shapes are possible as long as a point in time can be defined. The impulse shape and/or the impulse width can be chosen to define a first point in time t1. For example, the first point in time t1 can be defined as the point in time in which the voltage reaches a predefined percentage of the maximum voltage.

The impulse is created and applied at a first point in time t1. Voltage U4 relates to a voltage at a reference potential. The voltage impulse travels from the heating element 30 through the location of an event corresponding to a failure of a heating element into a conductor corresponding to the reference potential and is measured at a second point in time t2 when it reaches voltage supply and control system 50.

Voltage U3 is applied to one connection of heating element 30. In some examples, the second connection of heating element 30 is not connected and open. In other examples, the second connection of heating element is connected also to voltage supply and control system 50 and voltage U5 can be measured as shown in FIG. 5. Voltage U5 relates to a voltage at second connection 53 of heating element 30. The voltage impulse travels from first connection 52 through heating element 30 and second connection 53 back into voltage supply and control system 50. Voltage U5 and can be measured at a third point in time t3. The time between first point in time t1 and third point in time t3 should be a constant and should be independent from the location of the event corresponding to a failure of the heating element. An amplitude of the impulse measured at third point in time t3 is a measure of the intensity of the failure of the heating element at the location.

First and second point in time t1, t2 in FIG. 5 are shifted relative to each other depending on the location of the event corresponding to a failure of a heating element. The time difference between first and second point in time t1, t2 decreases with a distance between location of failure 31* and voltage supply and control system 50 creating. Time measurement can be done using a controller. In particular, the controller can be integrated in the voltage supply and control system 50.

Determine the location based at least on the first point in time and the second point in time may include comparing a time difference between first and second point in time t1, t2 to a predetermined time. The predetermined time can be, for example, calculated using the speed of the electric field in the heating element 30 and other conductors and the distance between the source of the voltage impulse and the detection of the voltage impulse. According to another aspect, the predetermined time can also be experimentally measured, for example, by creating multiple locations separately and calculating the correlation between time difference and location.

In some examples, the applied voltage impulse has at least an amplitude of an amplitude of an operation voltage of heating mat 30, specifically at least twice the amplitude of the operation voltage.

A wind turbine corresponding to the method is also suggested. The wind turbine comprises a wind turbine blade 22 and a heating element 30 at the wind turbine blade 22.

The heating element 30 comprising an electric resistive material configured to generate heat using electrical power, the wind turbine further comprising a voltage supply and control system 50 configured to: apply a voltage impulse to the heating element 30 relative to the reference potential at a first point in time t1; measure a voltage at the reference potential at a second point in time t2; and determining the location based at least on the first point in time and the second point in time. The wind turbine corresponds to the method described above and features relating to the method can be applied to the wind turbine.

This written description uses examples to disclose the invention, including the best mode, and also to enable any person skilled in the art to practice the invention, including making and using any devices or systems and performing any incorporated methods. The patentable scope of the invention is defined by the claims Clauses:
1. A method for identifying an event corresponding to a failure of a heating element at a wind turbine blade, the heating element comprising an electric resistive material configured to generate heat using electrical power, the method comprising:
    providing a desired value for a parameter indicative of a capacitance and/or or a leakage of the heating element relative to a reference potential;
    applying a voltage to the heating element relative to the reference potential;
    determining a real value of the parameter indicative of a capacitance of and/or or a leakage the heating element relative to a reference potential;
    comparing the real value to the desired value;
    determining, at least partially based on the comparison, whether an event corresponding to a failure of the wind turbine blade or the heating element in the wind turbine blade has occurred.
2. The method of clause 1, wherein determining a real value comprises:
    measuring electrical charge degradation of the heating element relative to a reference potential over time.
3. The method of any of the preceding clauses, wherein the reference potential is a potential of a ground conductor located at the blade.
4. The method of any of the preceding clauses, wherein the heating element is a heating mat and wherein the reference potential is a potential of a protective earth (PE) mat located adjacent the heating mat.
5. The method of clause 4, wherein the PE mat and the heating mat are insulated from each other with an insulation layer.
6. The method of any of the preceding clauses, wherein the heating element has an operation voltage and wherein the applied voltage to the heating element relative to the reference potential has a voltage amplitude which is at least an amplitude of the operation voltage, specifically at least twice the amplitude of the operation voltage.
7. The method of any of the preceding clauses, wherein the method further comprises:
    storing the real value in a database,
wherein determining whether an event corresponding to a failure of the wind turbine blade or the heating element in the wind turbine blade has occurred is further at least partially based on the one or more real values stored in the database.
8. A wind turbine comprising a wind turbine blade and a heating element at the wind turbine blade the heating element comprising an electric resistive material configured to generate heat using electrical power, the wind turbine further comprising a voltage supply and control system configured to:
    apply a voltage to the heating element relative to a reference potential; and
    determine a value of the parameter indicative of a capacitance and/or a leakage of the heating element relative to a reference potential,
    the wind turbine further comprising a controller configured to:
    compare the real value to the desired value;
    determine whether an event corresponding to a failure of the wind turbine blade or the heating element in the wind turbine blade has occurred.
9. A method for locating an event corresponding to a failure of a heating element at a wind turbine blade, the heating element comprising an electric resistive material configured to generate heat using electrical power, the method comprising:
    providing a location of an event corresponding to a failure of a heating element, wherein the heating element is in an Ohmic contact with a reference potential;
    applying a voltage impulse to the heating element relative to the reference potential at a first point in time;
    measuring a voltage at the reference potential at a second point in time;
    determine the location based at least on the first point in time and the second point in time.
10. The method of clause 9, wherein the voltage impulse is a needle impulse or a step impulse.
11. The method of any of the clauses 9 or 10, wherein the reference potential is a potential of a ground conductor located at the blade.
12. The method of any of the clauses 9 to 11, wherein the heating element is a heating mat and wherein the reference potential is a potential of a protective earth (PE) mat located adjacent the heating mat.
13. The method of clause 12, wherein the PE mat and the heating mat are insulated from each other with an insulation layer.
14. The method of any of the clauses 9 to 13, wherein the heating element has an operation voltage and wherein the applied voltage to the heating element relative to the reference potential has a voltage amplitude which is at least an amplitude of the operation voltage, specifically at least twice the amplitude of the operation voltage.
15. A wind turbine comprising a wind turbine blade and a heating element at the wind turbine blade the heating element comprising an electric resistive material configured to generate heat using electrical power, the wind turbine further comprising a voltage supply and control system configured to:
    apply a voltage impulse to the heating element relative to the reference potential at a first point in time;
    measure a voltage at the reference potential at a second point in time; and
    determining the location based at least on the first point in time and the second point in time.
16. The wind turbine of clause 15, wherein the voltage impulse is a needle impulse.
17. The wind turbine of clause 15 or 16, wherein the electric resistive material is carbon.

The invention claimed is:

1. A method for locating an event corresponding to a failure of a heating element at a wind turbine blade, the heating element having an electric resistive material configured to generate heat using electrical power, the heating element in Ohmic contact with a reference potential, the method comprising:
   applying a voltage impulse to the heating element relative to the reference potential at a first point in time;
   measuring a voltage at the reference potential at a second point in time; and
   determining the location corresponding to a failure of the heating element based on the first point in time and the second point in time.

2. The method of claim 1, wherein the voltage impulse is a needle impulse.

3. The method of claim 1, wherein the reference potential is a potential of a ground conductor located at the wind turbine blade.

4. The method of claim 1, wherein the heating element is a heating mat and wherein the reference potential is a potential of a protective earth (PE) mat located adjacent the heating mat.

5. The method of claim 4, wherein the PE mat and the heating mat are insulated from each other with an insulation layer.

6. The method of claim 1, wherein the heating element has an operation voltage and wherein the applied voltage impulse to the heating element relative to the reference potential has a voltage amplitude at least equal to an amplitude of the operation voltage.

7. A wind turbine, comprising:
   a blade;
   a heating element in the blade, the heating element comprising an electric resistive material configured to generate heat using electrical power;
   a voltage supply and control system configured to:
      apply a voltage impulse to the heating element relative to a reference potential at a first point in time;
      measure a voltage at the reference potential at a second point in time; and
      determining a location corresponding to a failure of the heating element based on the first point in time and the second point in time.

8. The wind turbine of claim 7, wherein the voltage impulse is a needle impulse.

\* \* \* \* \*